(12) United States Patent
Streett

(10) Patent No.: US 7,220,706 B1
(45) Date of Patent: May 22, 2007

(54) ENHANCED MELT-TEXTURED GROWTH

(75) Inventor: Scott H. Streett, Everett, WA (US)

(73) Assignee: Praxair S.T. Technology, Inc., North Haven, CT (US)

(*) Notice: Subject to any disclaimer, the term of this patent is extended or adjusted under 35 U.S.C. 154(b) by 202 days.

(21) Appl. No.: 10/438,119

(22) Filed: May 14, 2003

(51) Int. Cl.
C30B 29/16 (2006.01)
C04B 101/00 (2006.01)

(52) U.S. Cl. .................................... 505/451
(58) Field of Classification Search ............... 505/450, 505/451
See application file for complete search history.

(56) References Cited

U.S. PATENT DOCUMENTS

| | | | |
|---|---|---|---|
| 5,061,682 A | | 10/1991 | Aksay et al. .................. 505/1 |
| 5,306,700 A | * | 4/1994 | Hojaji ........................ 505/450 |
| 5,395,820 A | | 3/1995 | Murakami et al. .......... 505/126 |
| 5,462,917 A | * | 10/1995 | Salama et al. .............. 505/150 |
| 5,635,456 A | * | 6/1997 | Riley et al. ................. 505/501 |
| 5,856,277 A | | 1/1999 | Chen et al. ................. 505/452 |
| 5,872,081 A | * | 2/1999 | Woolf ......................... 505/450 |
| 6,046,139 A | | 4/2000 | Blohowiak et al. ......... 505/450 |
| 6,171,390 B1 | * | 1/2001 | Satoh et al. .................. 117/11 |

OTHER PUBLICATIONS

Choi et al., "The increase Of The Critical Current Density of $Yba_2Cu_3O_{7-y}$ By A Modified Melt-Textured Growth Method", Physica C 269, pp. 306-312 (1996).

* cited by examiner

Primary Examiner—Mark Kopec
(74) Attorney, Agent, or Firm—Iurie A. Schwartz

(57) ABSTRACT

A method for the enhanced melt-textured growth of superconducting crystals is disclosed for a sample having a first material capable of exhibiting superconducting properties. The sample is heated above a peritectic temperature of the first material, cooled below the peritectic temperature, and is subsequently subjected to a plurality of temperature spikes in which the sample is rapidly reheated above the peritectic temperature and recooled below the peritectic temperature to produce a superconducting crystalline structure substantially free of secondary nucleations. The resulting crystal is a superconducting crystalline structure comprising a plurality of bands formed in succession around a seed material. Each band has a non-uniform microstructure from an inner portion to an outer portion of the band.

21 Claims, 3 Drawing Sheets

ENHANCED MELT-TEXTURED GROWTH

TECHNICAL FIELD

The present invention relates to a method for enhancing the melt-textured growth of a superconducting crystalline structure and to a novel composition of matter for the resulting superconducting crystalline structure.

BACKGROUND OF THE INVENTION

Melt-texturing is a process of controlling peritectic solidification to obtain a bulk, crystalline material with a high degree of lattice orientation. In the field of high-temperature superconductors, melt-texturing is used to eliminate high angle grain boundaries in the final crystalline structure. Grain boundaries substantially eliminate the amount of current which can be carried without electrical resistance losses. Superconductors have numerous uses including, but not limited to, forming frictionless bearings or flywheels.

Conventional processes for melt-texturing superconductors begin with a composition of matter termed a "123-phase," a "123 YBCO" or a "Y-123" because the composition generally has the formula, $YBa_2Cu_3O_{7-x}$. Superconductors based on the $YBa_2Cu_3O_{7-x}$ system, where x #0.6, have been known since they were invented by IBM in 1986. These "high temperature superconductors" are superconducting at temperatures well above absolute zero, for example, at 77K or higher. U.S. Pat. No. 5,061,682, issued to Aksay et al., discloses a process for making conductive and superconductive ceramics including $Y_2BaCuO_5$, $YBa_2Cu_3O_7$, and $YBa_2Cu_4O_8$, and is incorporated by reference herein.

Conventional melt-texturing processes generally heat the 123 YBCO material above its peritectic temperature (approximately 1010° C. in air for the 123 YBCO system) to decompose the 123 YBCO into its peritectic mixture which contains a second material termed a "211-phase" or "Y-211," because the material generally has the formula $Y_2BaCuO_5$. The Y-123 also decomposes into a liquid rich in the Y (yttrium), Ba oxides, and Cu oxides. The mixture is subsequently supercooled slowly below the peritectic temperature of the 123 YBCO material. During this cooling period, the reverse reaction occurs wherein the Y-211 ($Y_2BaCuO_5$) reacts with the yttrium, the Ba oxides, and the Cu oxides in the liquid to reform 123 YBCO, which crystallizes at the supercooling temperature. Ideally, the 123 YBCO grains would nucleate uniformly such that their orientations align perfectly. However, in the supercooling period, there are often nucleations of grains with random orientations and spontaneous, secondary nucleations occur. These secondary nucleations are referred to as parasitic grains because they consume material available for the growth of desirable grains, create high angle grain boundaries upon their intersection with each other, and reduce the superconductive efficiency of the superconducting crystals.

Numerous processes are known and used to reduce these undesirable, secondary nucleations, however, such processes are incapable of halting these secondary nucleations once they begin to form. For example, U.S. Pat. No. 5,395,820, issued to Murakami et al., discloses a conventional procedure for a standard cooling cycle of 123-phase material. The process is a variation of a conventional Melt-Powdering-Melt-Growth process. The process includes the steps of combining the 123-phase with $BaCO_3$ and CuO to prepare a mixed powder, heating the mixed powder, melting the mixed powder to form a molten material, rapidly solidifying and cooling the molten material to form a solidified material, pulverizing the solidified material to form a fine powder, mixing 0.2 to 2.0% by weight of a platinum powder such as $PtBa_4Cu_2O_y$, with the pulverized fine powder, forming a body with the resultant mixture, heating the formed body to bring it to a partially-molten state, then lastly, cooling the partially-molten formed body to finely disperse a 211-phase and the platinum compound in a crystal of an oxide superconductor comprising a rare earth metal combined with $Ba_2Cu_3O_y$, where y is a number sufficient to provide oxide superconductivity. A superconductor of 123-phase type is thus produced, and the 211-phase and platinum compound are finely dispersed in a crystal of the 123-phase. Murakami, however, does not address any means of destroying secondary nucleations once they form. Furthermore, the process never increases the temperature of the system above the peritectic temperature of the 123-phase once crystallization of the 123-phase begins.

U.S. Pat. No. 6,046,139, issued to Blohowiak et al., also discloses a method of making single 123 YBCO crystal superconductors. In the method, 1–25 wt % of $Y_2BaCuO_5$ (211 YBCO material), 0.05–1.0 wt % Pt, and a balance of $YBa_2Cu_3O_{7-x}$ (123 YBCO material) are combined. Pt is believed to limit the growth of the non-superconducting 211-phase crystals. The resulting powder is pressed into a compact in a disk or other configuration. A seed crystal $SmBa_2Cu_3O_{7-x}$, where x=1.6, is in contact with and is placed substantially parallel to the compact's top surface. The compact is heated to a sintering temperature between 1010° C. and 1050° C. and held at that temperature for a time sufficient to fuse the seed crystal to the compact surface. The temperature is lowered at a rate of approximately 0.1–1.0° C. per hour. 123 YBCO crystal growth nucleates from the seed crystal as the materials cool. After nucleation, the compound is cooled at a rate of about 1–10° C. per hour to a temperature of approximately 950° C. 123 YBCO crystal growth radiates from the nucleation site until the entire compact consists essentially of single crystal, single grain 123 YBCO body. The process, however, does not increase the temperature over the peritectic temperature once crystallization begins, and therefore, there is no means of destroying secondary nucleations once they form.

Other conventional melt-texturing processes attempt to limit the detrimental secondary nucleations by slowly increasing the temperature during the growth phase. However, such processes are not very effective in growing substantial superconducting crystalline structures because the temperature is never raised over the peritectic temperature after the initial heating of the material, and therefore, the processes are incapable of sufficiently destroying secondary nucleations once they form. Moreover, this slow heating detrimentally slows growth of the crystalline structure. For example, U.S. Pat. No. 6,171,390, issued to Satoh et al., discloses a method for preparing a large oxide crystalline material wherein a Y-123 oxide superconductive crystalline precursor is added with seed crystals, supercooled below its peritectic temperature, and slowly heated while keeping the material in a supercooled condition to promote crystal growth. While the method gradually increases the temperature of the furnace during the growth stage to reduce secondary nucleations, this slow heating also reduces the crystal growth rate. Furthermore, the furnace temperature during the growth stage never reaches the peritectic temperature of the system, therefore, the process is incapable of destroying secondary nucleations once they form.

Other such melt-textured growth processes have been disclosed but such processes do not include raising the temperature above the peritectic temperature after the initial heating of the material during the growth phase of the superconducting crystal. "The Increase of the Critical Current Density of $YBa_2Cu_3O_{7-y}$ by a Modified Melt-Textured Growth Method" by Choi et al., Physica C 269, pp. 306–312 (1996) discloses a process for the melt-textured growth of superconducting crystals. The article discloses a quick dip in temperature to reduce the number of 123 nuclei after a mild increase in temperature. In the process, the 123 material is sequentially: 1) heated to 1007° C. for 20 minutes; 2) raised above the peritectic temperature to 1050° C. for 30 minutes; 3) rapidly cooled over 5 minutes to a temperature below the peritectic temperature; 4) soaked at the cooled temperature for 2 to 8 minutes; 5) raised over 2 minutes to a higher temperature (which is still below the peritectic temperature); 6) soaked at that temperature for [t] hours; 7) cooled to 960° C. at a rate of 1 to 8° C./hour; and 8) cooled to room temperature at a rate of 50° C./hour. The process may reduce the number of 123-phase nuclei during the initial slow-cooling process and also reduces the 211-phase particle size. However, the process does not disclose raising the temperature above the peritectic temperature after the initial heating and during the growth stage to promote crystal growth.

Other melt-texturing processes utilize parameters other than temperature to reduce growth of secondary nucleations. For example, U.S. Pat. No. 5,856,277, issued to Chen et al., discloses a method of manufacturing a textured layer of a high temperature superconductor via decreasing the partial pressure of $O_2$ in the atmosphere of the system to reduce the peritectic temperature of the system. The method includes providing an untextured high temperature superconductor material having a characteristic ambient pressure peritectic melting point, heating the superconductor to a temperature below the peritectic temperature, establishing a reduced $O_2$ atmospheric pressure causing a reduction of the peritectic melting point which causes melting from an exposed surface of the superconductor, and subsequent raising of the partial pressure of the $O_2$ in the atmosphere (while raising temperature) to cause solidification of the molten superconductor in a textured surface layer. However, once the $O_2$ partial pressure is increased to begin solidification of the superconductor, the process does not utilize a variation in oxygen concentration to selectively destroy detrimental, secondary nucleations that have formed in the process.

Additionally, the above mentioned processes do not disclose a means of growing numerous crystals in a single run. Typically, the above processes require expensive specialized ovens in which only one area within the oven is optimized for rapid 123-phase crystal growth with minimal secondary nucleations. Furthermore, the above-mentioned processes do not give rise to a resulting 123-phase crystalline structure having differing superconductivity properties within resulting growth bands of the crystalline structure.

Therefore, it would be desirable to provide a method for enhancing the melt-textured growth of a superconducting crystalline structure to produce a superconducting crystalline structure substantially free of secondary nucleations and having superior characteristics.

SUMMARY

In view of the deficiencies described above, it is an object of the present invention to provide a method for enhancing the melt-textured growth of a superconducting crystalline structure to produce a superconducting crystalline structure substantially free of secondary nucleations and having superior characteristics.

The present invention discloses a method for enhancing melt-textured growth of a superconducting crystalline structure wherein a sample comprising a first material capable of exhibiting superconductivity properties is subjected to a plurality of temperature spikes above and below the peritectic temperature of the first material such that detrimental secondary nucleations are destroyed and a superconducting crystalline structure is formed.

There is provided a sample with a first material which is capable of exhibiting superconducting properties when subjected to melt-textured growth. Preferably, the first material is a metal oxide, such as a rare earth metal oxide having the formula $REBa_2Cu_3O_{7-x}$ (RE-123), wherein RE is at least one rare earth metal selected from the group consisting of Y, Sm, Eu, Gd, Dy, Ho, Er, Nd, La, Pr, and Yb, and wherein x is a number sufficient to provide oxide superconductivity. Preferably, the sample is compressed into a pellet. A seed material is preferably placed on a top portion of the pellet to form a center from which the first material crystals grow. The seed material is also preferably a rare earth metal oxide material of the formula, $REBa_2Cu_3O_{7-x}$, but the RE is selected such that the seed material has a higher peritectic temperature, referred to herein as a "seed peritectic temperature," than the peritectic temperature of the first material because it is desirable that the seed material not melt during the subsequent heating of the sample.

The sample is heated to a temperature of at least 10° C. above the peritectic temperature of the first material, and preferably approximately 20° C. above the peritectic temperature, which brings the first material to a semi-molten state. Where the first material is a RE-123 material ($REBa_2Cu_3O_{7-x}$), virtually all the RE-123 material is melted into its peritectic mixture which comprises a solid called "RE-211" having the formula $RE_2BaCuO_5$, wherein RE is at least one rare earth metal selected from the group consisting of Y, Sm, Eu, Gd, Dy, Ho, Er, Nd, La, Pr, and Yb. The RE-123 material also melts into a liquid rich in the rare earth metal, a Ba oxide, and a Cu oxide. Subsequent to the initial heating over the peritectic temperature, the pellet is cooled such that the RE-211 and liquid react to reform RE-123 which begins to crystallize and propagate from the seed material. The repeated nucleation of RE-123 grains forms the superconducting crystalline structure. The pellet is preferably cooled to a temperature between 10° C. to 30° C. below the peritectic temperature of the first material, and preferably 20° C. below the peritectic temperature, for RE-123 formation.

The pellet is subsequently subjected to at least one temperature spike above and below the peritectic temperature of the first material. The pellet is first heated above the peritectic temperature to destroy RE-123 crystals which are misaligned and have a high angle grain boundary. These misaligned RE-123 crystals are remelted into solid RE-211 plus the liquid when the temperature is raised above the peritectic temperature. This raised temperature thus increases the concentration of RE-211 into solution and causes more of the rare earth metal (RE) to be deposited out as RE-123 when the pellet is recooled. The liquid phase also increases in Ba and Cu oxides, which increases the solubility of the rare earth metal in the liquid. Sufficient RE-123 remains after the initial temperature increase with which to resume crystal growth thereon because the temperature increase is for a relatively short duration. Once the sample is recooled, RE-211 again reacts with the liquid to continue formation of the superconducting crystalline structure. By increasing the number of temperature spikes and total furnace growth time, larger single crystals or multi-seeded bulk shapes can be formed. The sample must finally be oxygenated or annealed in order for the resulting crystalline structure to be acquire superconducting characteristics. One preferred manner in which to oxygenate the sample is to cool the sample to a temperature between 400° C. to 500° C. and place the sample in an oxygen rich environment. It is understood that "having a first material exhibiting superconducting properties when subjected to melt-textured growth," as used herein, incorporates the concept that the material may need to be oxygenated before it acquires superconductive properties.

The resulting crystalline structure comprises a plurality of bands formed in succession and propagating from a seed material wherein each band has a non-uniform microstructure from an inner portion of the band to an outer portion of the band. Each of the bands are defined as the area between successively nested boundaries. Specifically, each of the bands comprises a superconducting material occupying a space between successively nested boundaries which are configured as hollow rectangular polyhedrons. The hollow rectangular polyhedron is a shell of a polyhedron in which all opposing sides are parallel and its cross-section is rectangular. Each of the successively nested boundaries at least partially envelop the previous boundary. For example, when a seed material is placed on top of the sample, the successively nested boundaries will envelop the previous boundary on five sides. When a seed material is located in the center of the sample, the successively nested boundaries will envelop the previous boundaries on all sides to the extent the boundaries are contained within the pellet.

The resulting crystalline structure preferably contains a first metal oxide material such as RE-123, and a second metal oxide material such as RE-211. Within each band, there is a higher concentration of RE-123 on an inner portion of each band than on an outer portion of the band. There is also a higher concentration of RE-211 on the outer portion of each band than on the inner portion of each band because the RE-123 formation quickens once the step of recooling the sample during a temperature spike begins. From band to band, the concentration of RE-211 present at the inner portion of each succeeding band is greater than the concentration of RE-211 present at the inner portion of the immediately preceding band. Also, the concentration of RE-211 present at the outer portion of each succeeding band is greater than the concentration of RE-211 present at the outer portion of the immediately preceding band. The precise amount of RE-211 in the final crystalline structure, and the size and width of each band, can be controlled by varying the duration and magnitude of the recooling step within the temperature spike.

Other embodiments of the invention are disclosed which reduce the number of detrimental secondary nucleations. In one embodiment, a furnace in which the ambient environment can be controlled reduces the peritectic temperature of the sample by reducing the oxygen content in the ambient environment. The oxygen content is first reduced in the atmosphere to decompose the RE-123 from the outside of the pellet much like a spike in temperature. Oxygen is then reintroduced into the ambient environment to bring the sample back into an undercooled status where RE-123 crystals form. The sample is then subjected to a series of oxygen content spikes which are similar to the temperature spikes of the previous embodiments except a change in oxygen content is substituted for a change in temperature. The oxygen content is alternately decreased and increased to destroy secondary nucleations and promote growth of a superconducting crystalline structure.

Other features and advantages of the invention will be apparent from the following detailed description taken in conjunction with the following drawings.

DETAILED DESCRIPTION

Figure 1:
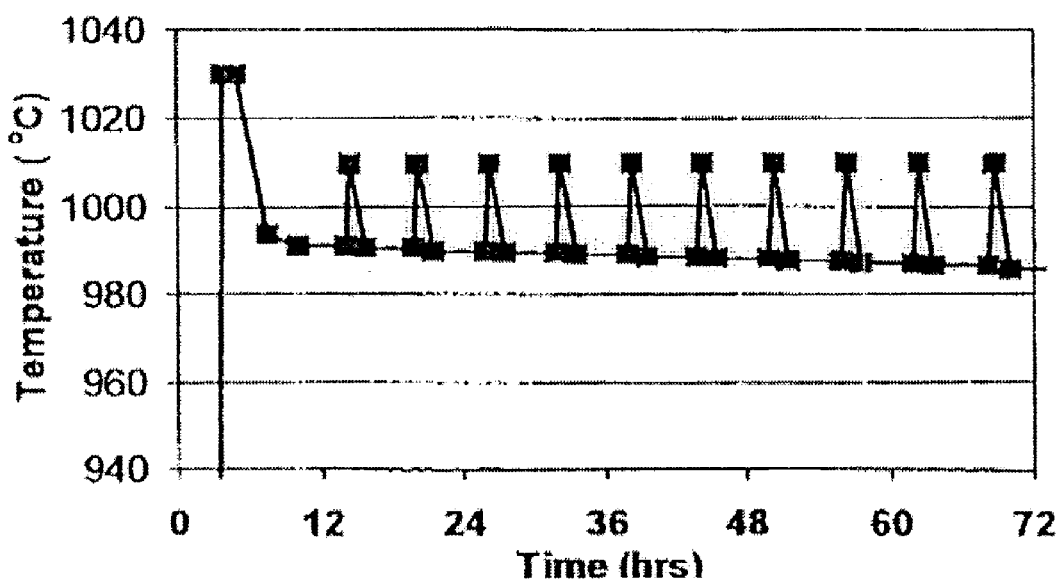
FIG. 1 is a graphical representation of the temperature sequence of a preferred embodiment of the present invention.

While this invention is susceptible of embodiments in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

The present invention is a method for enhancing the melt-textured growth of a superconducting crystalline structure wherein a sample comprising a first material capable of exhibiting superconducting qualities is subjected to a plurality of temperature spikes above and below the peritectic temperature of the first material such that detrimental secondary nucleations are destroyed and a superconducting crystalline structure is formed.

There is provided a sample with a first material which is capable of exhibiting superconducting properties when subjected to melt-textured growth. Preferably, the first material is a metal oxide, such as a rare earth metal oxide having the formula $REBa_2Cu_3O_{7-x}$ (RE-123), wherein RE is at least one rare earth metal also selected from the group consisting of Y, Sm, Eu, Gd, Dy, Ho, Er, Nd, La, Pr, and Yb, wherein x is a number sufficient to provide oxide superconductivity, for example, 0.6 or less, or any other suitable variable. In one preferred embodiment, the rare earth metal is Y. It is understood that the chemical formulation of the RE-123 is presently not necessarily precise and that the subscripts given represent at least approximate ratios of the respective elements. Preferably, the sample is compressed into a pellet via a compressor or any other suitable means. The first material is preferably pressed into a single die which is hexagonal in cross-sectional shape, but may be of any other suitable shape. In one preferred embodiment, the single die is 2" in diameter measured across a face of the die.

A seed material is preferably placed on a top portion of the pellet to form a center from which the first material crystals will propagate. However, the seed can optionally be positioned anywhere within the pellet, such as near its center.

The seed material is preferably a rare earth metal oxide material having a chemical formula $REBa_2Cu_3O_{7-x}$, wherein RE is at least one rare earth metal also selected from the group consisting of Y, Sm, Eu, Gd, Dy, Ho, Er, Nd, La, Pr, and Yb, and wherein x is a number sufficient to provide oxide superconductivity. The RE (rare earth metal) of the seed material is preferably selected such that the seed material has a higher seed peritectic temperature than the peritectic temperature of the first material because it is desirable that the seed material not melt during the subsequent heating of the sample. In one preferred embodiment, the rare earth metal of the seed material is Sm. It is understood that while the seed material may be a different material than the first material, the seed material optionally comprises the first RE-123 grains which form during the cooling steps of the method from which growth of the crystalline structure propagates.

The sample is heated to at least 10° C. above the temperature above a peritectic temperature of the first material, and preferably approximately 20° C. above the peritectic temperature, which brings the first material to a semi-molten state. Where the first material is a RE-123 material ($REBa_2Cu_3O_{7-x}$), virtually all the RE-123 material is melted into its peritectic mixture which comprises a solid called "RE-211" having the formula $RE_2BaCuO_5$, wherein RE is at least one rare earth metal also selected from the group consisting of Y, Sm, Eu, Gd, Dy, Ho, Er, Nd, La, Pr, and Yb. The RE-123 material also melts into a liquid rich in the rare earth metal, a Ba oxide, and a Cu oxide. Subsequent to the initial heating over the peritectic temperature, the pellet is cooled such that the RE-211 and liquid react to reform RE-123, which begins to crystallize and propagate from the seed material. The repeated nucleation of RE-123 grains forms the superconducting crystalline structure. Preferably, the pellet is cooled to a temperature 10 to 20° C. below the peritectic temperature for RE-123 formation.

The pellet is subsequently subjected to at least one temperature spike above and below the peritectic temperature of the first material. The pellet is first heated above the peritectic temperature to destroy RE-123 crystals which are misaligned and have high angle grain boundaries. These misaligned RE-123 crystals are remelted into its peritectic mixture comprising solid RE-211 and liquid when the temperature is raised above the peritectic temperature of the first material. The raised temperature increases the concentration of RE-211 into solution and causes more of the rare earth metal (RE) to be deposited out as RE-123 when the pellet is recooled. The liquid phase also increases in Ba and Cu oxides, which increases the solubility of the rare earth metal in the liquid. Sufficient RE-123 remains after the initial temperature increase with which to resume crystal growth thereon because the temperature increase is for a relatively short duration. Once the sample is recooled, RE-211 again reacts with the liquid to continue formation of the superconducting crystalline structure. By increasing the number of temperature spikes and total furnace growth time, larger single crystals or multi-seeded bulk shapes can be formed.

If there were no secondary nucleations in the resulting crystalline structure, only uniform crystals of RE-123 would form on the seed material. Some of the RE-123 would trap smaller RE-211 grains, especially away from the seed material. However, secondary nucleations with high angle grain boundaries often form away from the seed material which lower the superconductivity of the resulting crystalline structure. The subsequent steps of the present invention halt the growth of the secondary nucleations and allow RE-123 to grow through the remnants of these secondary nucleations, by subjecting the pellet to at least one temperature spike.

In the temperature spike sequence of the method, the pellet is first heated above the peritectic temperature to destroy the RE-123 crystals which are misaligned and have a high angle grain boundary. Specifically, the increase in temperature remelts the RE-123 secondary nucleations back into its peritectic mixture and the concentration of RE-211 in solution is increased such that more of the rare earth metal (RE) can be deposited out as RE-123. The liquid phase also increases in concentration of Ba oxides and Cu oxides, which increase the solubility of the rare earth metal in the liquid. In a preferred embodiment, the temperature is increased to a reheating temperature of 10° C. over the peritectic temperature of the first material at a rate of 1° C./min. During the reheating phase of the temperature spike, much of the RE-123 material that crystallized in the initial cooling phase remelts such that crystallization easily resumes once the temperature is decreased again. Enough RE-123 remains after the initial temperature increase with which to resume crystal growth thereon because the temperature increase is for a very short duration.

Figure 2:
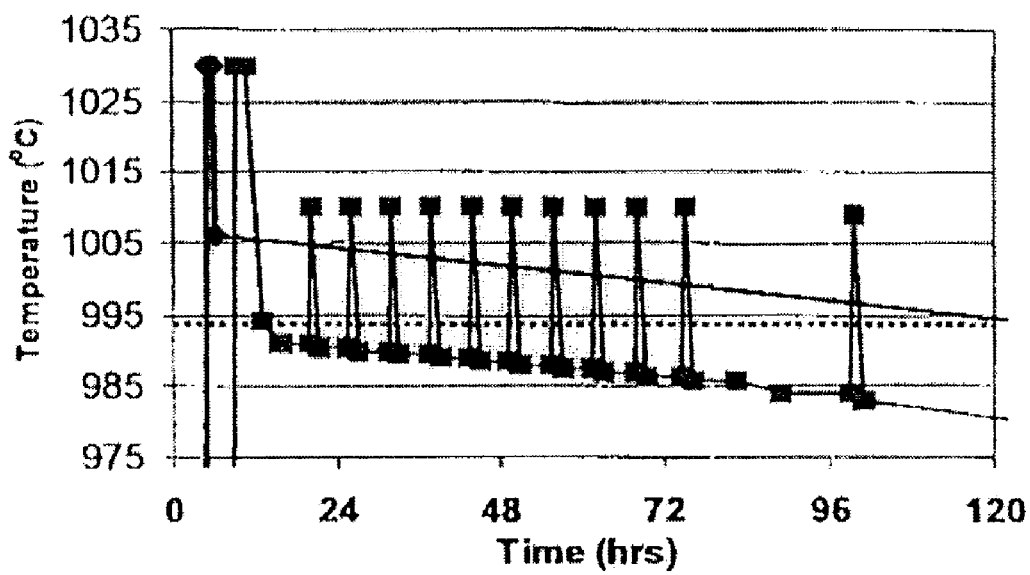
FIG. 2 is a graphical representation of the temperature sequence of another preferred embodiment of the present invention.
Figure 3:
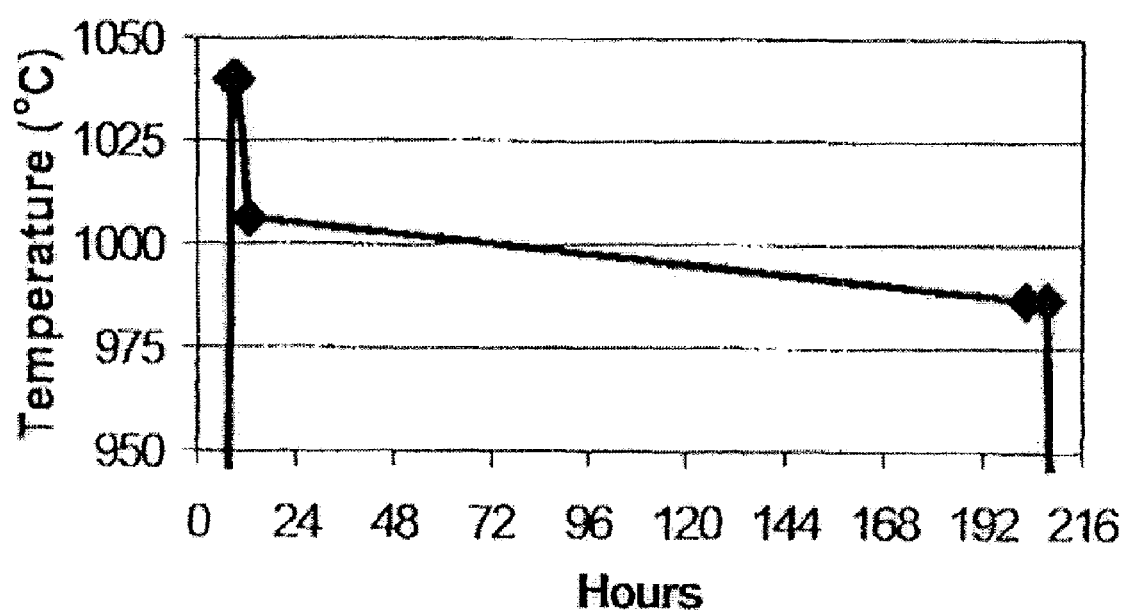
FIG. 3 is a graphical representation of the temperature sequence of a prior art melt-textured growth method.

The pellet is lastly recooled to a recooling temperature which is preferably between 10° C. and 35° C. below the peritectic temperature of the RE-123 material wherein crystallization of the RE-123 material resumes. Preferably, the pellet is recooled at an initial rate of 0.5° C./min. As grains of the RE-123 material begin to crystallize, a portion of the available RE-211 is not reacted and a number of such RE-211 grains are trapped between RE-123 grains as the RE-123 crystallizes. These trapped RE-211 particles are non-conducting and thus create pinning centers with the formed superconducting RE-123 crystalline structure such that a magnetic field can rotate around the outer perimeter of the resulting crystal. Since the amount of liquid decreases with each subsequent temperature spike, the amount of RE-211 increases, and thus the rate of RE-123 crystallization further decreases during the cooling period of each subsequent spike. However, this decrease in liquid and decrease in RE-123 formation with each subsequent temperature spike can be countered if desired by extending the cooling period duration and temperature of the cooling period. Therefore, when using a plurality of temperature spikes, the cooling portion of each temperature spike can reach a successively cooler temperature to promote RE-123 crystal growth. In a preferred embodiment of the invention, eight such temperature spikes are used culminating in a temperature spike which cools to a recooling temperature 35° C. below the peritectic temperature of the first material. FIG. 1 is a graphical representation of the temperature sequence of a prior art melt-textured growth method. FIG. 2 and FIG. 3 are each a graphical representation of a temperature sequence of a preferred embodiment of the present invention.

By increasing the number of temperature spikes and total furnace growth time, larger single crystals or multi-seeded bulk shapes can be formed. After being subjected to at least one temperature spike, the sample is oxygenated or annealed in order for the resulting crystalline structure to acquire superconducting characteristics. One preferred manner in which to oxygenate the sample is to cool the sample to a temperature between 400° C. to 500° C. and place the sample in an oxygen rich environment. It is understood that "having a first material exhibiting superconducting properties when subjected to melt-textured growth," as used herein, incorporates the concept that the material may need to be oxygenated or annealed before it acquires superconductive properties. Likewise, it is understood that the terms "superconductive crystalline structure," as used herein, refer to the structure of the material produced via the disclosed process, both before and after an oxygenation has occurred, regardless of whether the structure has acquired superconducting characteristics at that stage.

Typically, the resulting crystalline structure measures between 2–4 inches in diameter and between 0.5–2 inches in thickness and the method requires approximately 4–8 days to complete. The resulting superconducting crystalline structure comprises a plurality of bands formed in succession and propagating from a seed material, wherein each band has a non-uniform microstructure from an inner portion of the band to an outer portion of the band. Each of the bands are defined as the area between successively nested boundaries. Specifically, each of the bands comprises a superconducting material occupying a space between successively nested boundaries being configured as hollow rectangular polyhedrons. The hollow rectangular polyhedron is a shell of a polyhedron in which all opposing sides are parallel and its cross-section is rectangular. Each of the successively nested boundaries at least partially envelop the previous boundary. For example, when a seed material is placed on top of the sample, the successively nested boundaries will envelop the previous boundary on five sides. When a seed material is located in the center of the sample, the successively nested boundaries may envelop the previous boundaries on all sides to the extent the boundaries are contained within the pellet.

Preferably, the superconducting crystalline structure within each band comprises a first metal oxide material such as $REBa_2Cu_3O_{7-x}$ (RE-123), wherein RE is at least one rare earth metal selected from the group consisting of Y, Sm, Eu, Gd, Dy, Ho, Er, Nd, La, Pr, and Yb and x is a number capable of providing oxide superconductivity. The seed material is also preferably a material of the same formula, $REBa_2Cu_3O_{7-x}$, wherein RE is at least one rare earth metal selected from the group consisting of Y, Sm, Eu, Gd, Dy, Ho, Er, Nd, La, Pr, and Yb and x is a number capable of providing oxide superconductivity. However, the rare earth metal of the seed material is selected to provide the seed material with a higher seed peritectic temperature than the peritectic temperature of the first material. It is understood that while the seed material may be a different material than the first material, the seed material may also comprise the first grains of the first material which form during the growth of the crystalline structure. The superconducting crystalline structure further comprises particles of a second metal oxide material having a formula of $RE_2BaCuO_5$ (RE-211), wherein RE is at least one rare earth metal selected from the group consisting of Y, Sm, Eu, Gd, Dy, Ho, Er, Nd, La, Pr, and Yb.

When the RE-123 material is heated above its peritectic temperature in the formation phase, the RE-123 material decomposes into its peritectic mixture comprising a solid RE-211 material and a liquid containing the rare earth element, and Cu and Ba oxides. When the temperature is then cooled below the peritectic temperature, the RE-211 and liquid react to reform RE-123 and RE-123 crystallizes. Therefore, during each temperature spike, when the temperature is raised above the peritectic temperature, RE-123 will decompose into RE-211 and when the temperature is dropped below the peritectic temperature, RE-211 will aid in reforming RE-123. The width of composition of the bands can be controlled via varying the recooling temperature and the reheating temperature of the temperature spikes.

For example, when the pellet is first cooled, the crystallization of RE-123 will be very quick and the first band will quickly form because there is a multitude of reactable RE-211 and liquid. With each subsequent temperature spike, the amount of liquid is decreased and thus the rate of RE-123 crystallization decreases during the recooling period of each subsequent spike. Therefore, the bands of the crystalline structure will decrease in width in at least one dimension as each of the bands form from the seed material if the recooling temperature is kept constant after each spike.

Furthermore, within each band, there is a higher concentration of RE-123 on an inner portion of each band than on an outer portion of the band. There is also a higher concentration of RE-211 on the outer portion of each band than on the inner portion of each band because the RE-123 formation is initially quick once the recooling begins. Additionally, as the RE-123 crystals form, RE-211 is pushed in front of RE-123 growth. From band to band, the concentration of RE-211 present at the inner portion of each succeeding band is greater than the concentration of RE-211 present at the inner portion of the immediately preceding band. Also, the concentration of RE-211 present at the outer portion of each succeeding band is greater than the concentration of RE-211 present at the outer portion of the immediately preceding band. The resulting crystalline structure further comprises impurities, also termed "porosities," which are concentrated in various areas and which are non-uniform from the inner portion to the outer portion of each band.

A superconducting element formed in this fashion is capable of multiple possible applications, including a switch having numerous distinct outputs from activation of various bands in response to varying current levels in a control conductor.

The decrease in liquid, rare earth metal concentration, and in RE-123 formation with each subsequent temperature spike can be countered by extending the cooling period duration and temperature of the cooling period. Therefore, bands of substantially the same size can be formed by appropriately dropping the recooling temperature with each subsequent spike and also by extending the cooling period. If the cooling periods are not significantly extended nor the cooling temperature dropped, the bands will decrease in width in at least one dimension in a direction moving away from the seed material. If the cooling periods are adjusted, the bands may be made substantially equivalent in width in at least one dimension if desired.

Figures 4A, 4B, 4C, 4D:
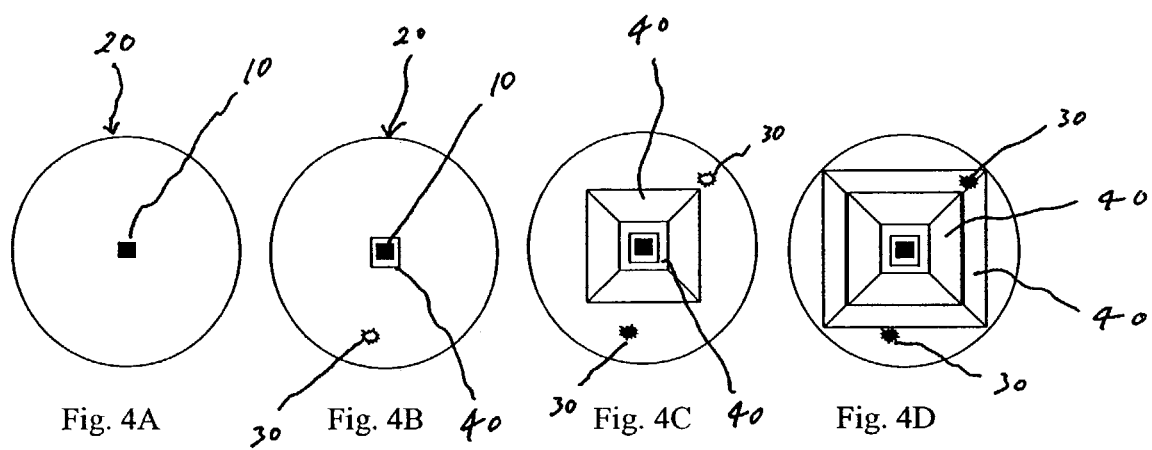
FIG. 4A is a top view of a sample showing a seed before crystalline growth in a preferred embodiment of the present invention.
FIG. 4B is a top view of a sample showing crystalline growth after one temperature spike in a preferred embodiment of the present invention.
FIG. 4C is a top view of a sample showing crystalline growth after two temperature spikes in a preferred embodiment of the present invention.
FIG. 4D is a top view of a sample showing crystalline growth after three temperature spikes in a preferred embodiment of the present invention.

Referring to FIG. 4A, the seed material 10 is placed in the middle of a compacted powder pellet 20. Referring to FIG. 4B, the figure represents the beginning of the seeded domain growth. A secondary nucleation 30 is represented in the lower portion of the pellet 20. The secondary nucleation 30 would be seen as a more reflective spot in an otherwise dull black pellet 20. FIG. 4C illustrates a pellet 20 that has been subjected to a temperature spike, however an additional distinct band 40 has been added. FIG. 4D illustrates a pellet 20 that has been subjected to an additional temperature spike. Due to the temperature spikes, the secondary nucleation 30 is stopped and growth from the seed 10 grows through the remnants of these parasitic nucleations 30. Each successive band 40 is more reflective than the previous band 40 in a direction away from the seed material 10.

Other embodiments of the invention are disclosed which reduce the number of detrimental secondary nucleations. In one embodiment, a furnace in which the ambient environment can be controlled reduces the peritectic temperature of the sample by reducing the oxygen content in the ambient environment. The oxygen content is first reduced in the atmosphere to decompose the RE-123 from the outside of the pellet much like a spike in temperature. Oxygen is then reintroduced into the ambient environment to bring the sample back into an undercooled status where RE-123 crystals form. The sample is then subjected to a series of oxygen content spikes which are similar to the temperature spikes of the previous embodiments except a change in oxygen content is substituted for a change in temperature. The oxygen content is alternately decreased and increased to destroy secondary nucleations and promote growth of a superconducting crystalline structure. Alternatively, the peritectic temperature could be reduced by reducing the atmospheric pressure and the peritectic temperature could be increased by increasing the atmospheric pressure within the ambient environment.

In another embodiment of the invention, the pellet does not contain a seed material having a different chemical formula from the first material. In this embodiment, the pellet is subjected to the same series of steps of the method to form the superconducting crystalline structure. The initial RE-123 crystals which form provide a seed from which other RE-123 crystals propagate. Since the present invention allows for the selective destruction of secondary nucleations, the method is also conducive to non-seeded texturing methods. For example, when the pellet is ready to be subjected to at least one temperature spike, the pellet could be visually inspected to determine the optimum recooling temperature, reheating temperature, rate of recooling, and rate of reheating by monitoring band growth.

In yet another embodiment of the present invention, the temperature of the system may be increased locally via a laser or microwave or by any other suitable means. Rather than heating the entire pellet to limit a few secondary nucleations, heat is directed to only specific locations. For example, one could focus a laser across the surface of a pellet avoiding any desirable growth while heating other areas and leaving them inhospitable for competing growth.

In yet another embodiment of the present invention, a modifier may be added to the pellet as a dopant/modifier. The modifier is generally platinum, cerium, or silver, but other elements could be added including gold, ruthenium or palladium. RE-123 accepts many elements as dopants such as calcium, lithium, strontium, uranium, zinc, and zirconium. The modifiers enhance the melting of the RE-123 material and thus the destruction of secondary nucleations and also may act as pinning centers or diminish any damaging effects of the temperature spikes. The dopants enhance the pinning of superconducting currents and improve properties of the resulting superconducting crystalline structure.

EXAMPLE 1

Thirty grams of commercially available powder of nominal composition $Y_{1.254}Ba_{2.127}Cu_{3.127}O_{7.635-x}$+0.25 wt % Pt was pressed at 5,000 lbs. in a 1.15" cylindrical steel die. After forming, the powder was further compacted in a Cold Isostatic Press (CIP) to a pressure of 25 kpsi. The pellet was then sintered at 900° C. for 8 hours. A pellet density of >6.0 g/cc is optimum.

Following the sintering of the pellet, a seed material having the formula $SmBa_2Cu_3O_{7-x}$ ("Sm-123") was placed on top of the dense pellet and placed in a furnace for heat treatment/growing. The growth furnace was heated to between 1025–1045° C. for 75 minutes to bring the pellet to a semi-molten state wherein substantially all the RE-123 was melted without melting the Sm-123 seed material. The furnace was then cooled below the peritectic temperature of RE-123 (approximately 1010° C.) to subject the pellet to a supercooled condition and to promote oriented growth starting at the seed. After 1–12 hours of growing at temperatures below the peritectic temperature the pellet was subjected to eight temperature spikes wherein the furnace setpoint was increased to 1020° C. and quickly cooled to approximately 20° C. below the peritectic temperature to 990° C. Optimum conditions resulted in 1–3 mm of new growth from each undercooling before a spike in temperature was advisable to eliminate secondary nucleations.

EXAMPLE 2

120 grams of powder of nominal composition $Y_{1.254}Ba_{2.127}Cu_{3.127}O_{7.635-x}$+0.25 wt % Pt was pressed at 2,000 lbs in a hexagonal steel die. The die size resulted in a powder compact with about 1.78" of material between parallel faces 1" thick. After forming, the powder compact was further compacted in a CIP to a pressure of 25 kpsi. In this embodiment, the compact was not sintered prior to growth heat treatment.

A Sm-123 seed crystal was placed on top of the pellet and placed in a box-furnace for heat treatment/growing. The furnace was heated to 1030° C. at a rate 3° C./min and held for 95 minutes followed by 1.5° C./min cooling to 1006.2° C. The material was then slowly cooled until growth could be easily observed around 995° C.

A series of temperature spikes were programmed into the furnace controller each consisting of heating to >1014° C. at a rate of 0.85° C./min and cooling back to growth temperatures below 995° C. at an initial rate of 0.45° C./min with the cooling rate slowing as growth temperatures were approached. After 12 programmed temperature spikes were run, an additional slow cooling period brought the furnace temperature to 974° C. to ensure complete alignment of the Y-123 material with the seed. The furnace was subsequently rapidly cooled to room temperature at a rate of 2.1° C./min.

While the specific embodiments have been illustrated and described, numerous modifications come to mind without significantly departing from the spirit of the invention, and the scope of protection is only limited by the scope of the accompanying claims.

What is claimed is:

1. A method for enhancing melt-textured growth of a superconducting crystalline structure comprising:
   providing a sample in the form of a pellet having a first material capable of exhibiting superconducting properties when subjected to melt-textured growth,
   providing said pellet with a seed material prior to heating said sample above a
   peritectic temperature of said first material,
   cooling said sample below the peritectic temperature of said first material,
   subjecting said sample to at least one temperature spike wherein said sample is reheated above the peritectic temperature of said first material to a reheating temperature and subsequently recooled below the peritectic temperature of said first material to a recooling temperature to produce a superconducting crystalline structure substantially free of secondary nucleations.

2. The method according to claim 1, wherein said first material is a metal oxide.

3. The method according to claim 2, wherein said metal oxide has a chemical formulation of $REBa_2Cu_3O_{7-x}$, wherein RE is at least one rare earth metal selected from the group consisting of Y, Sm, Eu, Gd, Dy, Ho, Er, Nd, La, Pr, and Yb, and wherein x is a number sufficient to provide oxide superconductivity.

4. The method according to claim 3, wherein RE is Y.

5. The method according to claim 3, wherein said first material decomposes into a peritectic mixture of the first material comprising a second metal oxide material having a chemical formula $RE_2BaCuO_5$, wherein RE is at least one rare earth metal selected from the group consisting of Y, Sm, Eu, Gd, Dy, Ho, Er, Nd, La, Pr, and Yb, and a liquid containing the RE, a Ba oxide, and a Cu oxide.

6. The method according to claim 5, wherein RE is Y.

7. The method according to claim 1, wherein said seed material has a chemical formula of $REBa_2Cu_3O_{7-x}$, wherein RE is at least one rare earth metal selected from the group consisting of Y, Sm, Eu, Gd, Dy, Ho, Er, Nd, La, Pr, and Yb, wherein x is a number sufficient to provide oxide superconductivity, and wherein said rare earth metal is selected to provide said seed material with a higher seed peritectic temperature than the peritectic temperature of said first material.

8. The method according to claim 7, wherein RE is Sm.

9. The method according to claim 1, wherein the step of subjecting said sample to at least one temperature spike comprises subjecting said pellet to a plurality of said temperature spikes, wherein each of said spikes beginning with a second one of said spikes comprises a lower recooling temperature than the recooling temperature of the immediately preceding spike.

10. The method according to claim 9, wherein a last spike of said plurality of temperature spikes comprises a recooling temperature of at least 35° C. below the peritectic temperature of said first material.

11. The method according to claim 1, further comprising sintering said pellet at a temperature below the peritectic temperature of the first material prior to the step of heating said sample above a peritectic temperature of said first material.

12. The method according to claim 11, wherein the step of heating said sample above a peritectic temperature of said first material comprises heating said pellet to a temperature approximately 10° C. above the peritectic temperature of the first material to bring the first material to a semi-molten state.

13. The method according to claim 12, wherein the step of cooling said pellet below the peritectic temperature of said first material comprises cooling said pellet to a temperature approximately 10° C. below the peritectic temperature of the first material to promote crystalline structure growth.

14. The method according to claim 13, wherein said reheating temperature is at least approximately 10° C. above the peritectic temperature of the first material and said recooling temperature is at least approximately 10° C. below the peritectic temperature of the first material.

15. The method according to claim 14, wherein the step of subjecting said sample to at least one temperature spike comprises subjecting said sample to a plurality of said temperature spikes wherein each of said spikes comprises a lower recooling temperature than the recooling temperature of the immediately preceding spike.

16. The method according to claim 1, wherein said pellet further comprises a modifier to enhance the melting of said first material and the destruction of secondary nucleations within said pellet.

17. The method according to claim 16, wherein said modifier is selected from the group consisting of cerium, gold, platinum, palladium, ruthenium and silver.

18. The method according to claim 1, wherein said pellet further comprises a dopant to enhance the destruction of secondary nucleations within said pellet.

19. The method according to claim 18, wherein said dopant is selected from the group consisting of calcium, lithium, strontium, uranium, zinc, and zirconium.

20. The method according to claim 1, wherein said pellet is formed via compressing said first material into a die.

21. The method according to claim 20, wherein said die is substantially hexagonal in cross-sectional shape.

* * * * *